United States Patent
Illing et al.

(10) Patent No.: US 10,256,814 B2
(45) Date of Patent: Apr. 9, 2019

(54) ENHANCED SEMICONDUCTOR SWITCH

(71) Applicant: Infineon Technologies AG, Neubiberg (DE)

(72) Inventors: Robert Illing, Finkenstein (AT); Veli Kartal, Munich (DE); Fang Lu-Ruhbach, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 526 days.

(21) Appl. No.: 14/932,572

(22) Filed: Nov. 4, 2015

(65) Prior Publication Data

US 2017/0126227 A1    May 4, 2017

(51) Int. Cl.
*H03K 17/94* (2006.01)
*H03K 17/082* (2006.01)

(52) U.S. Cl.
CPC ......... *H03K 17/94* (2013.01); *H03K 17/0822* (2013.01); *H03K 2217/0027* (2013.01)

(58) Field of Classification Search
None
See application file for complete search history.

(56) References Cited

U.S. PATENT DOCUMENTS

| | | | |
|---|---|---|---|
| 5,747,975 A * | 5/1998 | Colandrea | H03K 17/0822 323/276 |
| 6,903,595 B2 | 6/2005 | Won | |
| 7,747,879 B2 * | 6/2010 | Tofigh | H02H 1/0015 361/42 |
| 7,777,472 B2 | 8/2010 | Uehara | |
| 9,479,163 B2 | 10/2016 | Sander et al. | |
| 2003/0051177 A1 * | 3/2003 | Koo | G06F 1/3215 713/300 |
| 2004/0239399 A1 | 12/2004 | Won | |
| 2011/0316509 A1 * | 12/2011 | Chen | H02M 1/32 323/282 |
| 2014/0077782 A1 * | 3/2014 | Cortigiani | H03K 17/0822 323/284 |
| 2016/0182039 A1 * | 6/2016 | Xiao | H03K 17/18 307/115 |

FOREIGN PATENT DOCUMENTS

| CN | 101154889 A | 4/2008 |
|---|---|---|
| CN | 101247087 A | 8/2008 |
| CN | 201113793 Y | 9/2008 |
| CN | 104348460 A | 2/2015 |

OTHER PUBLICATIONS

Office Action, in Chinese language, from counterpart Chinese Patent Application No. 201610916528.2, dated Feb. 2, 2018, 6 pp.
Office Action, in the Chinese language, from counterpart China Application No. 201610916528.2, dated Oct. 9, 2018, 9 pp.

* cited by examiner

*Primary Examiner* — Jared Fureman
*Assistant Examiner* — Joel Barnett
(74) *Attorney, Agent, or Firm* — Shumaker & Sieffert, P.A.

(57) ABSTRACT

An first embodiment relates to a device comprising: a first semiconductor switch; an integrated sensor for determining a current that passes the first semiconductor switch; and a terminal to which a signal is provided in case the current fulfills a predetermined condition. Also, a system comprising such device, and a method of operation are suggested.

20 Claims, 6 Drawing Sheets

ENHANCED SEMICONDUCTOR SWITCH

BACKGROUND OF THE INVENTION

The present disclosure relates to an enhanced semiconductor switch, in particular a semiconductor switch with added functionality.

SUMMARY

A first embodiment relates to a device comprising:
a first semiconductor switch;
an integrated sensor for determining a current that passes the first semiconductor switch;
a terminal to which a signal is provided in case the current fulfills a predetermined condition.

A second embodiment relates to a system comprising the device as described herein and a processing unit, wherein the terminal of the device is connected to the processing unit and the signal is conveyed from the processing unit to wake up the processing unit from an idle mode.

A third embodiment relates to a method comprising:
determining via a sensor a current that passes a first semiconductor device, wherein the sensor and the semiconductor device are part of a single device,
providing a signal to a processing unit in case the current fulfills a predetermined condition,
waking up the processing unit based on the signal.

A fourth embodiment is directed to a device comprising:
means for determining via a sensor a current that passes a first semiconductor device, wherein the sensor and the semiconductor device are part of a single device,
means for providing a signal to a processing unit in case the current fulfills a predetermined condition,
means for waking up the processing unit based on the signal.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

A so-called PROFET is known as a protected transistor (in particular field effect transistor, FET), i.e. a transistor comprising an added functionality, e.g., protection of itself and/or a circuitry which the transistor is embedded in or connected to. The PROFET may be a high-side switch that is placed between the supply and load in order to control an application. The high-side switch comprises a broad range of features, e.g., protection and diagnostic functions. The PROFET is capable of addressing all kinds of resistive, capacitive and inductive loads. It can be used in a big variety of automotive, commercial, agricultural & industrial applications.

Figure 1:
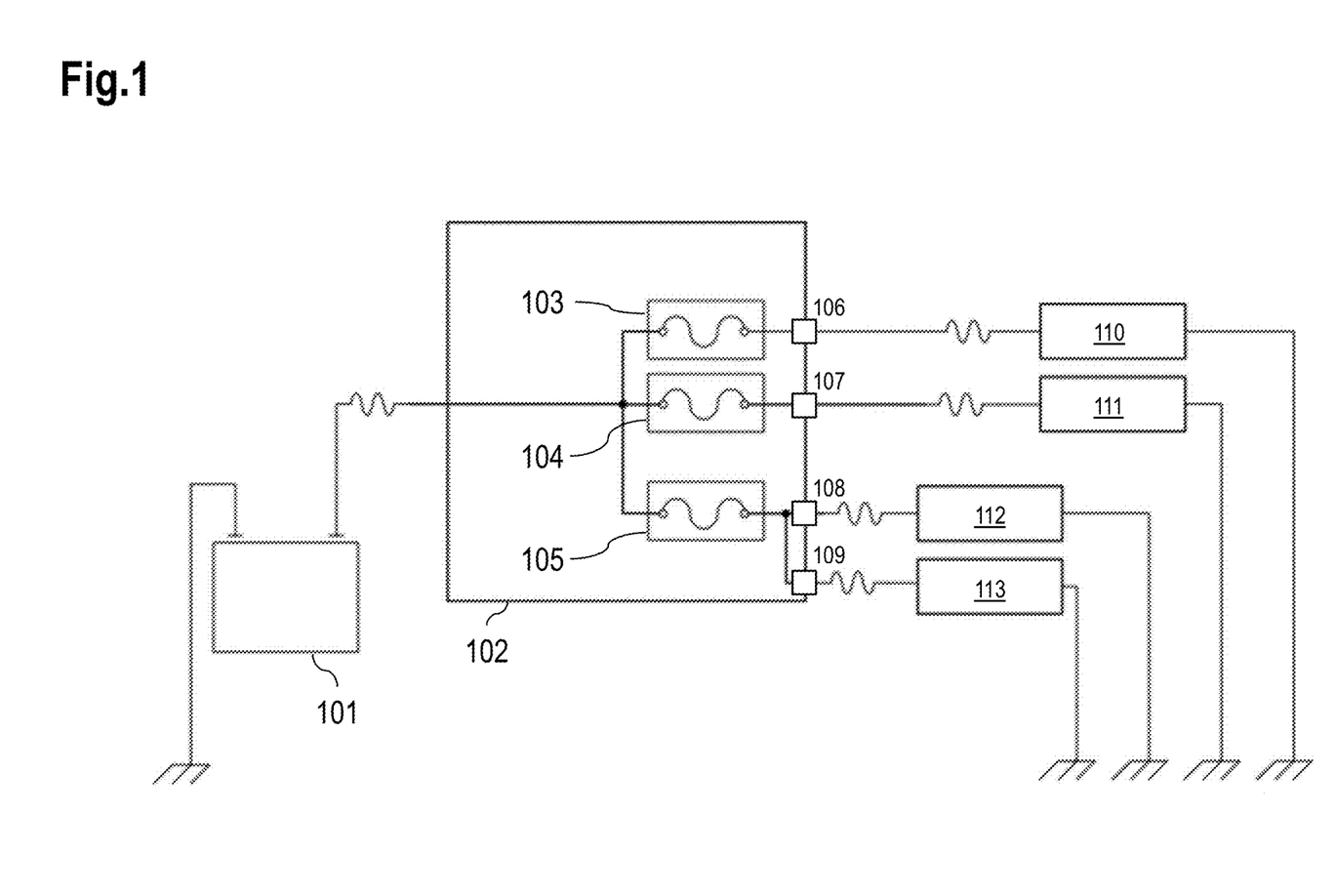
FIG. 1 shows an exemplary use case scenario with a battery connected between ground and an energy distribution unit, which comprises several fuses, each of the fuse being connected to at least one electronic control unit.

FIG. 1 shows an exemplary use case scenario with a battery 101 connected between ground and an energy distribution unit 102. The energy distribution unit 102 provides several terminals KL30 106 to 109 (which is also known as a connection to the positive pole of the battery 101). In this example of FIG. 1 the distribution unit 102 connects the positive pole of the battery 101
via a fuse 103 to the terminal 106,
via a fuse 104 to the terminal 107 and
via a fuse 105 to the terminals 108 and 109.

Each of the terminals 106 to 109 is connected via an electronic control unit (ECU) 110 to 113 in series with a load to ground. Instead of the terminal KL30, a terminal KL15 may be used, which corresponds to a connection to the battery via an ignition key switch.

Each of the fuse 103 to 105 may be replaced by a high-side switch with added functionality. For many applications a low-current consumption mode (also referred to as idle mode) may be beneficial.

Figure 2:
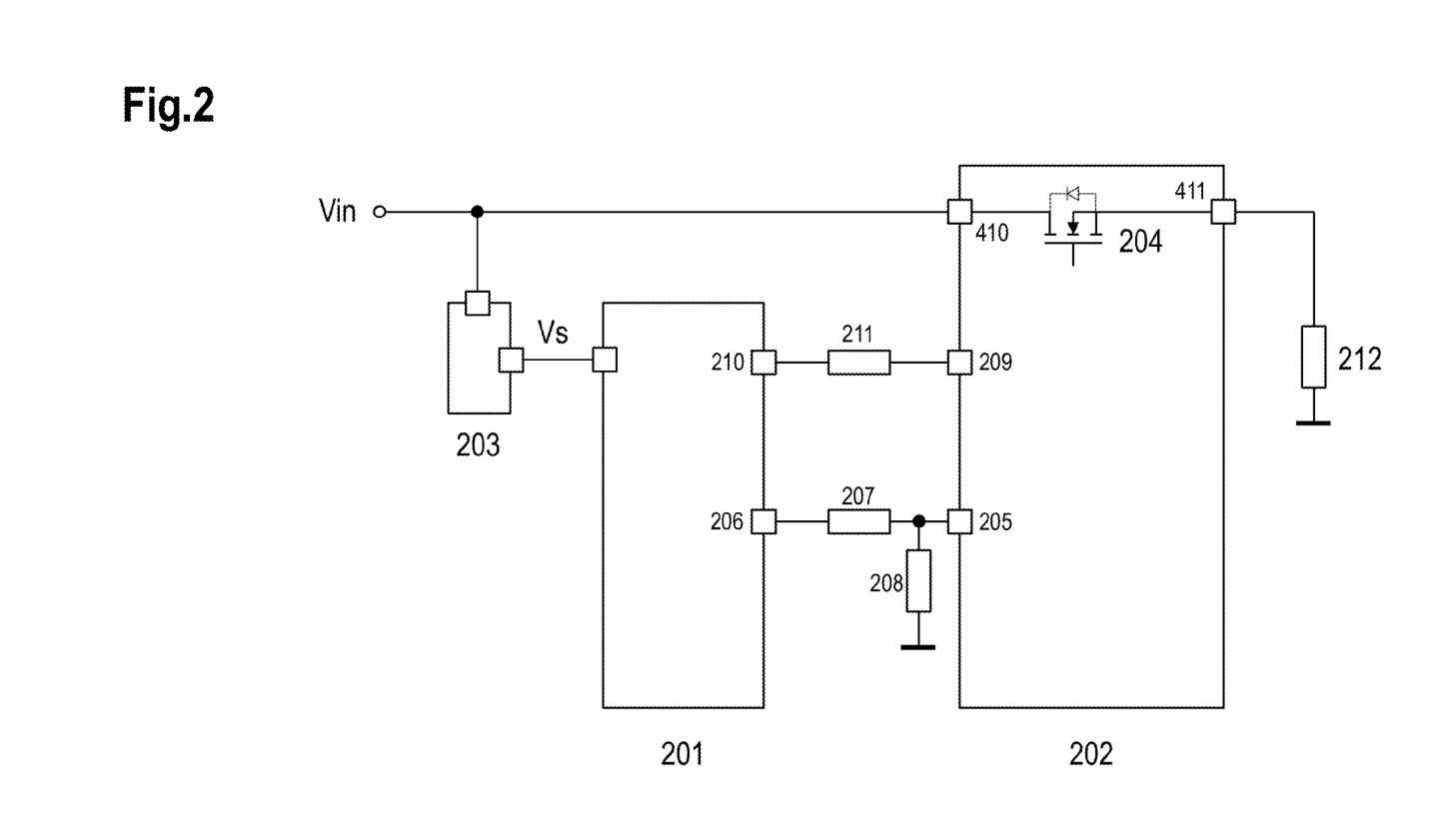
FIG. 2 shows an exemplary circuitry comprising a microcontroller and an enhanced switch, which exchange signals.

FIG. 2 shows an exemplary circuitry. Based on an input voltage Vin, a voltage regulator 203 provides a regulated low voltage Vs for a microcontroller 201. The microcontroller 201 drives a switch 202, which may be a smart power high side switch. The microcontroller 201 and the switch 202 may together provide a protection behavior of a fuse for a load 212 (e.g., a cable). The switch 202 may comprise at least one power MOSFET 204 that is able to convey a current towards the load 212 via its drain-source path. The switch 202 may be a protected FET (PROFET) with additional functionalities.

There may be three main states that may be considered for providing a fuse functionality:
(1) Protection of the load 212 by the microcontroller 201:
In case the drain-source current Ids through the switch 202 is lower than a nominal DC current Idc (Ids<Idc), the current consumption of the system is an important parameter.

A possible scenario may be as follows: The microcontroller 201 and the switch 202 are in a low current consumption mode (LCCM) resulting in a low supply current in the order of 100 µA. Every several milliseconds, the microcontroller 201 may exit the LCCM to check the current. This can be done by the microcontroller 201 by checking its port 206, which is connected to a port 205 of the switch 202 via a resistor 207. Also, the port 205 may be connected via a resistor 208 to ground. The port 206 may be connected to an analog-to-digital converter (ADC), which allows digitizing the current value provided by the port 205 of the switch 202. The switch 202 may permanently sense the source-drain current and supply a value associated with this current at the port 205. The problem, however, is that by processing this value at its port 206, the microcontroller 201 needs to exit the LCCM, which results in a temporary current Isupply~100 µA, which is significantly higher than the current required by the system when the microcontroller 201 is in the LCCM (Isupply~100 µA). After the measurement, the microcontroller 201 may re-enter the LCCM.

(2) Protection of the load 212 by the microcontroller 201 and the switch 202:

In case the current flowing towards the load 212 is above the nominal DC current Idc and below a current itripmin of the switch, protection of the load is either done by the current measurement of the microcontroller 201 via the port 205 of the switch 202 (in this case the microcontroller 201 may check $I^2t$) or it is done by the switch 202 itself via, e.g., thermal shut down.

(3) Protection of the load 212 by the switch 202:

Is the current flowing towards the load between the current Itripmin and a current Itripmax, a protection of the load 212 is provided by the switch 202.

It is noted that the port may also be referred to as pin.

Figure 3:
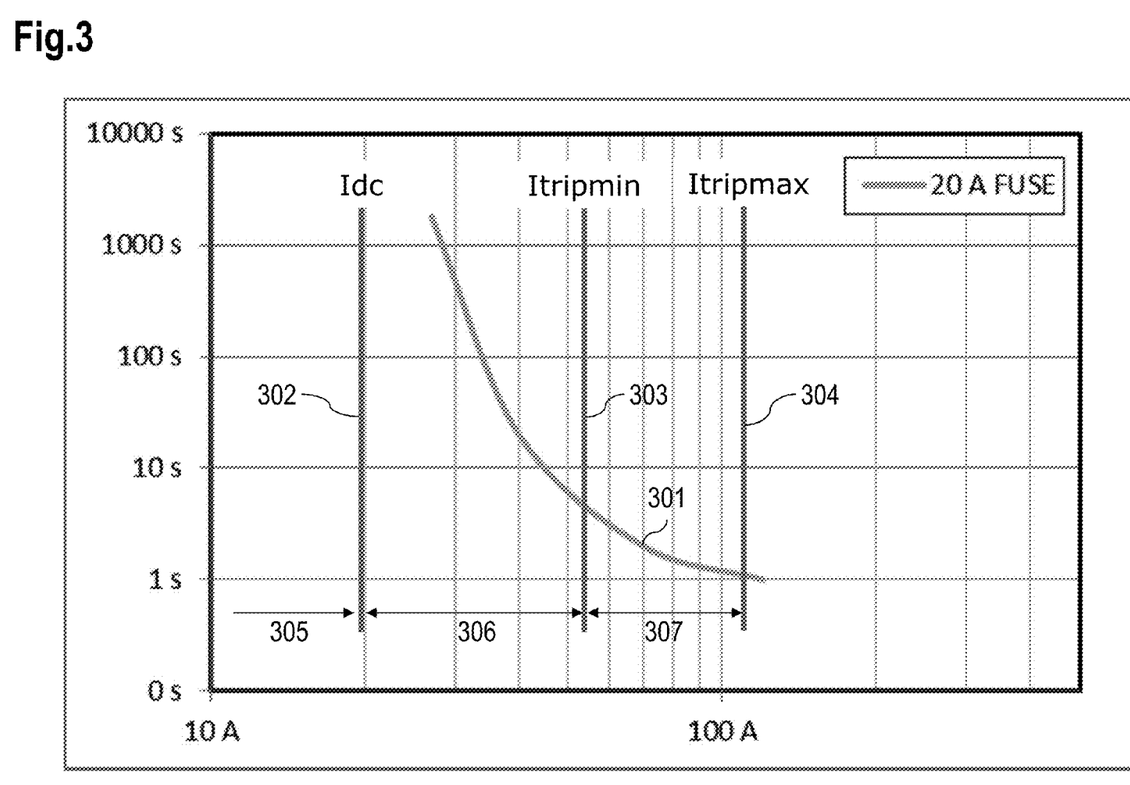
FIG. 3 shows an exemplary diagram comprising a characteristic curve of a fuse, a curve of a nominal DC current, a curve of a current Itripmin and a curve of a current Itripmax.

FIG. 3 shows an exemplary diagram comprising a characteristic curve 301 of a (20 A) fuse, the nominal DC current I& 302, the current Itripmin 303 and the current Itripmax 304. A range 305 corresponds to the state (1) described above, a range 306 corresponds to the state (2) described above and a range 307 corresponds to the state (3) described above.

As indicated, it may be disadvantageous that the system consumes a significant amount of power due to the higher current in the state (1) when the microcontroller has temporarily left its idle mode for determining whether an action (like disabling the power switch) may be required. Such a wake-up may occur every several milliseconds and it may hence contribute to the overall power consumption of the system.

According to an example, a current measurement comparator is provided, which measures the current Ids during the IDLE mode. If this current Ids is above the nominal current level Idc, the microcontroller can be provided with a signal to wake up the microcontroller. For example, the microcontroller can be woken up via an interrupt. Hence, the microcontroller enters the LCCM (and stays in the LCCM) until it is woken up by the switch.

This is shown FIG. 2 by an IDLE port 209 of the switch 202, which is connected with an IRQ port 210 of the microcontroller 201 via a resistor 211. The switch 202 determines if the IDLE mode is over (by detecting an increase in the drain-source current Ids reaching or exceeding the threshold of the nominal current Idc) and wakes the microcontroller 201 via a signal conveyed from its port 209 to the IRQ port 210 of the microcontroller 201.

This approach bears the advantage that the current consumption of the system comprising the microcontroller 201 and the switch 202 can be further reduced, because frequent measurements of the microcontroller 201 that require the microcontroller to (unnecessarily) leave its LCCM can be avoided. In addition, the system by itself is able to decide when to enter the LCCM. This may be in particular beneficial for applications like body control modules.

Figure 4:
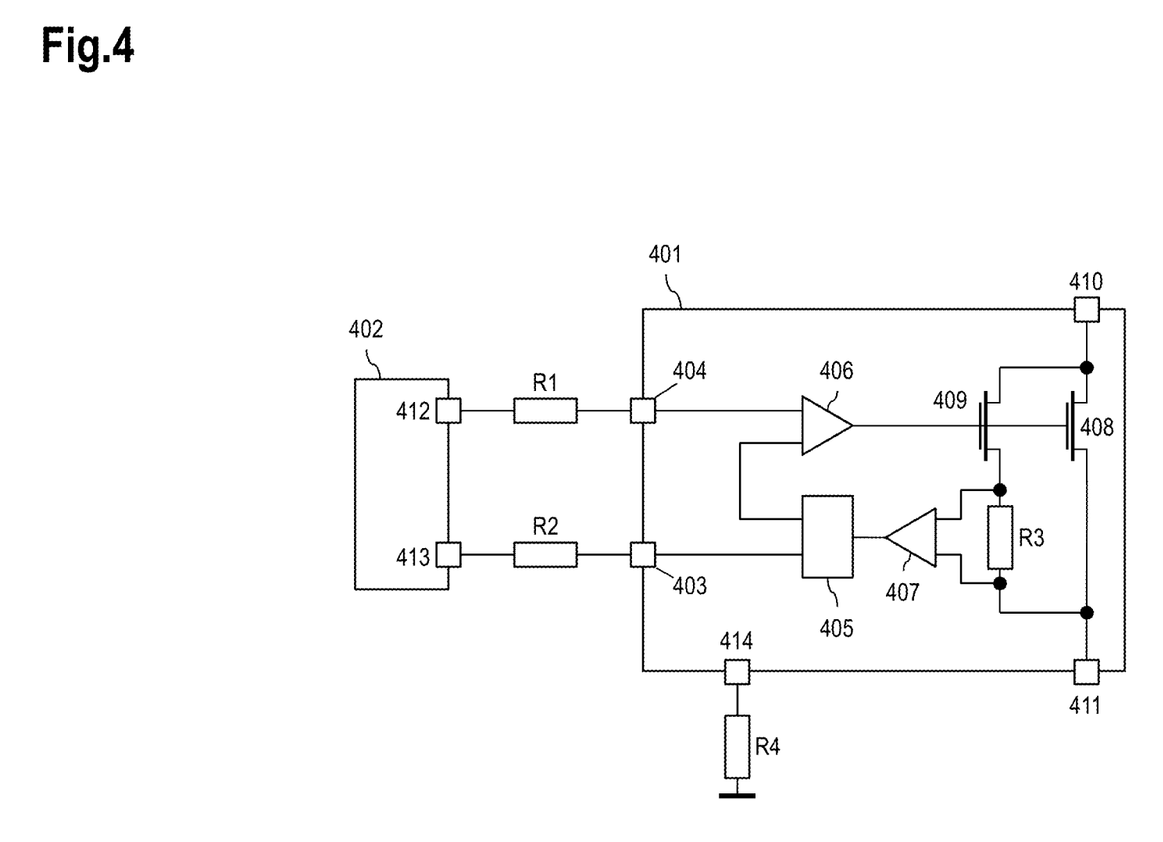
FIG. 4 shows an exemplary circuit diagram of a switch that actively measures its drain-source current and wakes a microcontroller in case the drain-source current fulfills a predefined condition.

FIG. 4 shows an exemplary circuit diagram of a switch 401 that actively measures its drain-source current and wakes a microcontroller 402 in case the drain-source current fulfills a predefined condition. The predefined condition may be at least one of the following:

the drain-source current reaches or exceeds a first threshold current (e.g., a nominal current),
the drain-source current reaches or falls below a second threshold current (e.g., a nominal current).

The drain-source current may in particular be measured in an idle mode of the circuitry. The switch 401 may trigger the microcontroller 402 to wake up, e.g., via an interrupt port 413 of the microcontroller 402, in case the predefined condition is met. For that purpose, the switch may comprise a port 403 that is connected via a resistor R2 to the interrupt port 413 of the microcontroller 402.

The switch 401 further comprises a power n-channel MOSFET 408 with its drain connected to a port 410 of the switch 401. The source of the MOSFET 408 is connected to a port 411. Parallel to the MOSFET 408 a sensing n-channel MOSFET 409 is provided: its drain is connected to the port 410 and its source is connected via a resistor R3 to the port 411. The MOSFET 409 may be a low-power MOSFET with a smaller active area compared to the active area of the power MOSFET 408. Hence, the current flowing across the drain-source path of the power MOSFET 408 is mirrored into the drain-source path of the MOSFET 409 reduced according to the ratio of their active areas. For example, if the MOSFET 409 has 1/200 of the active area of the MOSFET 408, a current amounting to 2 A flowing across the drain-source path of the MOSFET 408 results in a current amounting to 2 A/200=10 mA flowing through the drain-source path of the MOSFET 409. The resistor R3 acts as a shunt (or sense) resistor converting the current into a voltage that drops across this resistor R3. This voltage is input to a comparator 407. The output of the comparator is connected to a logic circuit 405.

Hence, depending on the voltage across the resistor R3 (i.e. the current passing this resistor R3), the comparator 407 provides an output signal to the logic circuit 405, which then determines whether or not to wake up the microcontroller 402 by sending a wake-up signal via the port 403 towards the interrupt port 413 of the microcontroller 402.

The logic circuit 405 is further connected to a driver 406 of the switch 401. The output of the driver 406 is connected to the gates of the MOSFETs 408 and 409. Hence, the logic circuit 405 may enable or disable the gates of the MOSFETs 408 and 409. Also, a port 404 of the switch 401 is connected via a resistor R1 to a port 412 of the microcontroller 402. The port 404 is also connected to the driver 406 to either enable or disable the gates of the MOSFETs 408 and 409, This allows the microcontroller 402 to enable or disable the MOSFETs 408 and 409.

A load may be connected between the port 411 and ground. The port 410 may be connected or connectable to a supply voltage, e.g., a battery.

A port 414 of the switch 401 may be connected to ground via a resistor R4, The switch 401 may be actively switched between different power modes, wherein in a first power mode the switch 401 consumes a normal current amounting to, e.g., 3 mA and in a second power mode (also referred to as idle mode) the switch 401 consumes an idle current amount to, e.g., 50 µA. Dependent on the current sensed by the resistor R3, the switch 401 may enter the first power mode or the second power mode.

Figure 5:
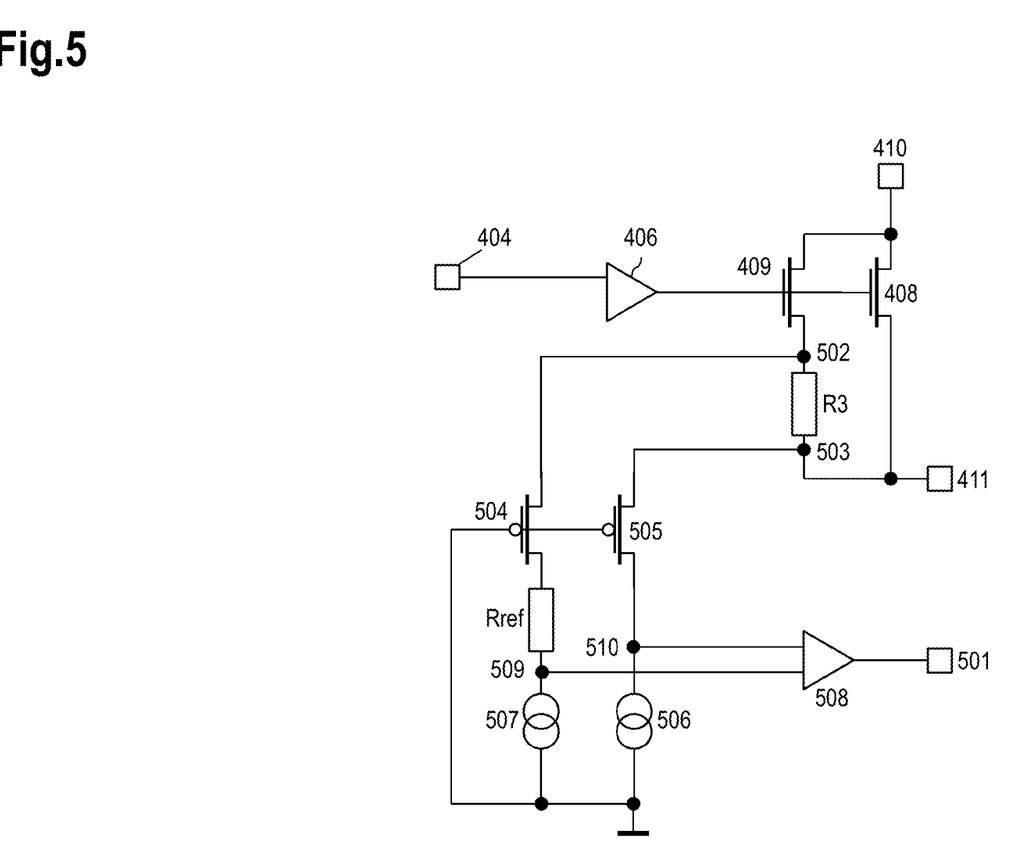
FIG. 5 shows an exemplary circuit diagram of the comparator of FIG. 4 in more detail.

FIG. 5 shows an exemplary circuit diagram of the comparator 407 in more detail. As explained with regard to FIG. 4, the resistor R3 acts as a sense resistor; its connection to the source of the MOSFET 409 is referred to as a node 502 and its connection to the port 411 is referred to as a node 503.

The node 502 is connected to the source of a p-channel MOSFET 504, the drain of the MOSFET 504 is connected via a resistor Rref to a node 509. The node 509 is connected to the first input of a comparator 508 and the node 509 is connected across a current source 507 to ground.

The node 503 is connected to the source of a p-channel MOSFET 505, the drain of the MOSFET 505 is connected to a node 510. The node 510 is connected to the second input of the comparator 508 and the node 510 is connected across a current source 506 to ground.

The gate of the MOSFET 505 and the gate of the MOSFET 504 are connected to ground.

The output of the comparator 508 is connected to the port 501.

A portion of the current through the power MOSFET 408 is replicated by the sense MOSFET 409. The sensed current is transferred into voltage by the sense resistor R3. A reference voltage is generated by the reference resistor Rref and the current source 507. The comparator 508 is switching as soon as the voltage over the resistor R3 is bigger than the voltage over the resistor Rref. The resistor R3 and the resistor Rref may be of the same resistor type in order to compensate or reduce any effects due to varying temperature.

Figure 6:
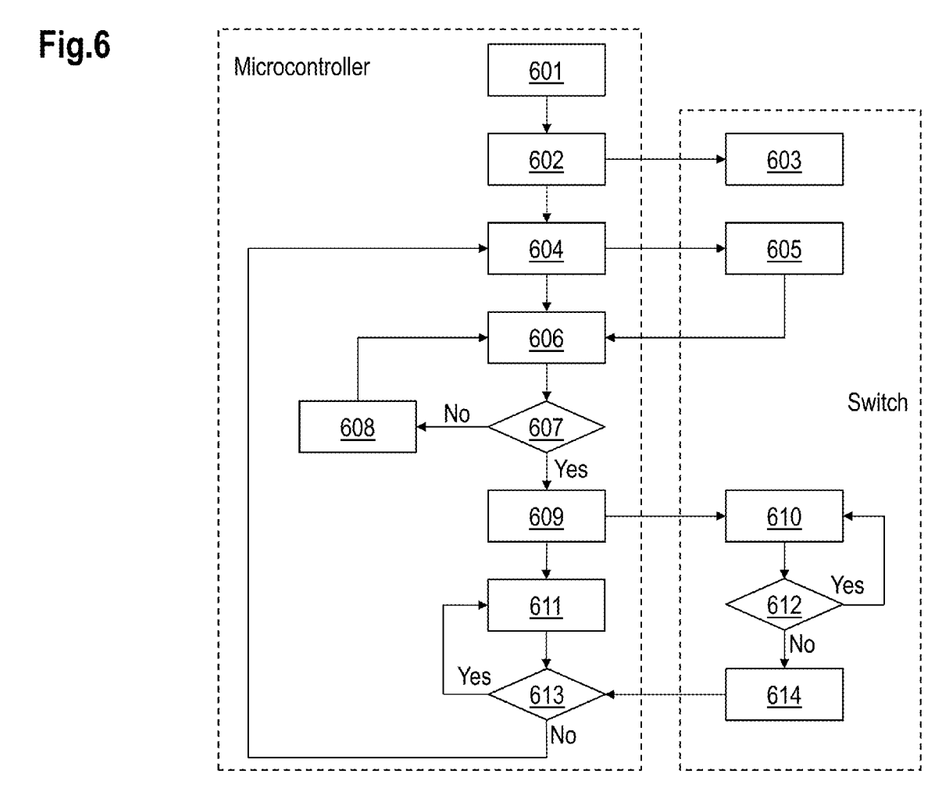
FIG. 6 shows a flow diagram of an operation between the microcontroller the switch.

FIG. 6 shows a flow diagram of an operation between the microcontroller and the switch. In a step 601, the microcontroller starts operation. In a step 602, the microcontroller switches the switch on. This is reflected in a step 603 which shows the switch entering operation.

In a step 604, the microcontroller initiates determining the drain-source current by triggering a sensing step 605 at the switch. The microcontroller determines the drain-source current in a step 606 based on the information provided by the switch in the step 605.

in a step 607 the microcontroller checks whether the drain-source current is below a threshold (e.g., 20 A). If not, a fuse functionality is calculated by the microcontroller in a step 608 and it is branched to step 606. If the drain-source current is below the threshold, the microcontroller in a step 609 leaves the mode where it determines the drain-source current, indicates towards the switch that it is about to enter an idle mode and enters the idle mode in a step 611. In a step 610, the switch becomes aware of the fact that the microcontroller is about to enter the idle mode and subsequently checks in a step 612 whether the drain-source current is below the threshold. In the affirmative, step 612 branches to step 610 and the switch stays in the idle mode. If the drain-source current is not below the threshold, a step 614 is entered by the switch, which initiates an interrupt at the microcontroller. Also, in the step 614 the switch may consume a reduced amount of power (the idle current described above). Hence, the switch by itself is capable of determining the power mode and consume an idle current (in the order of, e.g., 50 µA) or a normal current (in the order of, e.g., 3 mA).

The microcontroller entered its idle state in the step 611. In a step 613 the microcontroller checks whether an interrupt signal is present. If not, step 613 branches to step 611 and the microcontroller stays in the idle mode. If the interrupt signal is detected, step 613 is left and step 604 is entered.

The examples suggested herein may in particular be based on at least one of the following solutions. In particular combinations of the following features could be utilized in order to reach a desired result. The features of the method could be combined with any feature(s) of the device, apparatus or system or vice versa.

A device is provided, the device comprising:
a first semiconductor switch;
an integrated sensor for determininga current hat passes the first semiconductor switch;
a terminal to which a signal is provided in case the current fulfills a predetermined condition.

It is noted that determining a current that passes the first semiconductor switch may comprise determining a current signal that corresponds to the current that passes the first semiconductor switch. In particular, a value can be determined that is (substantially) proportional to the current that passes the first semiconductor switch. For example, the current passing the first semiconductor switch may be determined by a sensing semiconductor switch, which may be arranged substantially in parallel to the first semiconductor switch. In particular, a current mirror can be used combining the first semiconductor switch and the sensing semiconductor switch.

The first semiconductor switch may comprise at least one transistor. It may in particular comprise a field effect transistor (FET) or a power FET. The first semiconductor switch may be connected in a current path towards a cable of load.

The terxinal amay be connected to processing device, e.g., processor, microcontroller, etc., for conveying the signal towards the processing device. The signal may be used to wake up the processing from an idle state. This may be achieved by connecting the terminal to an interrupt port (IRQ port) of the processing device.

In an embodiment the signal is provided to the terminal an idle mode of the device.

Hence, the device, e.g., switch, may be capable of determining a power mode and set its current consumption accordingly. In a first power mode (idle mode) the current may be in the order of 30 µA to 50 µA, wherein in a second power mode (normal mode) the current consumed by the device is in the order of milliampere.

in an embodiment, the predetermined condition is that the current reaches or exceeds a first threshold current.

In an embodiment, the predetermined condition is that the current reaches or falls below a first threshold current.

The first threshold current may be a nominal current.

In an embodiment, the integrated sensor comprises a second semiconductor switch.

The second semiconductor switch may comprise at least one transistor, in particular at least one FET. The second semiconductor switch may also be referred to a sense semiconductor switch.

In an embodiment, the second semiconductor switch is arranged to provide a portion of the current that passes the first semiconductor switch.

The first semiconductor switch and the second semiconductor switch may be arranged as a current mirror. In one embodiment, the first semiconductor switch and the second semiconductor switch may be connected via their gates and the drains. The source of the first semiconductor switch is connected to a port of the device that is connected to the current path towards the load; the second semiconductor switch may be connected across a resistor to this port. Also, the first semiconductor switch and the second semiconductor switch may be arranged on a single chip, they may in particular share the same active area, whereas the first semiconductor switch has a substantially larger active area than the second semiconductor switch. The ratio between the active areas of the first and second semiconductor switches may determine the currents flowing through them. For example, in case the first semiconductor switch and the second semiconductor switch are MOSFETs and the first semiconductor switch has an active area that is by a factor k larger than the active area of the second semiconductor switch, the drain-source current passing the second semiconductor switch is 1/k of the drain-source current passing the first semiconductor switch.

The resistor may be used as a sense resistor: A voltage drop across such resistor can be used to determine whether the signal is provided to the terminal indicating that the predetermined condition is met (or not).

In an embodiment, the second semiconductor switch and the first semiconductor switch are arranged as a current mirror, wherein the first semiconductor switch has a larger active area than the second semiconductor switch.

The active area of the first semiconductor switch may be at least 5 times larger than the active area of the second semiconductor switch.

In an embodiment, the device is an integrated switching element.

This integrated switching element may also be referred to as protected transistor, protected FET or PROFIT. The switching element is also referred to as switch or smart switch, which indicates that there is a power transistor and some additional, in particular monitoring, functionality.

In an embodiment, the device comprises an enable terminal, via which the first semiconductor switch can be switched on or off.

Such enable terminal may be used to enable or disable the first semiconductor switch. A driver may be provided with the device, which is triggered by the signal applied to the enable terminal. The enable terminal may be connected to a processing device, e.g., processor, microcontroller, etc., for driving the first semiconductor switch of the device.

It is noted that the (first and/or second) semiconductor switch may comprise at least one of the following:
  a transistor;
  a MOSFET;
  an IGBT;
  a JFET;
  a diode;
  a vertical element;
  a protected FET;
  a high-side switching element;
  a low-side switching element;
  an electrical relay.

The (first and/or second) semiconductor switch may be a vertical element comprising
  a control terminal,
  a first terminal,
  second terminal
    wherein the first and the second terminal are electrically coupled via a signal applied to the control terminal and
    wherein the control terminal and the first terminal are arranged on one side of the vertical element and the second terminal is arranged at the opposite side of the vertical element.

The opposite side of the vertical element may also be connected to a load. The second terminal may be a collector of an electronic switch, in particular a transistor or IGBT. The first terminal may be an emitter and the control terminal may correspond to a gate of an IGBT or a base of a bipolar transistor. In case of a MOSFET, the source may correspond to the first terminal and the drain may correspond to the second terminal.

In an embodiment, the device comprises circuitry which is arranged to
  determine whether or not the current fulfills a predetermined condition and
  provide the signal towards the terminal in case the current fulfills a predetermined condition.

In an emboditnent, the circuitry is arranged to control the first semiconductor switch in case of an internal condition is met.

The device itself via said circuitry can, e.g., switch off the first semiconductor switch in case a high temperature or a high current condition is detected. Also, the circuitry may (re-)activate the first semiconductor switch in case the temperature reaches or drops below a predetermined value.

In an embodiment, the device is used in an automotive environment.

Also a system is provided comprising the device as described herein and a processing unit, wherein the terminal of the device is connected to the processing unit and the signal is conveyed from the processing unit to wake up the processing unit from an idle mode.

The processing unit may be a processor or microcontroller or the like.

In an emboditnent, the processing unit enables a fuse-characteristics by controlling the first semiconductor switch of the device based on the current provided by the device.

Further, a method is provided comprising:
  determining via a sensor a current that passes a first semiconductor device, wherein the sensor and the semiconductor device are part of a single device,
  providing a signal to a processing unit in case the current fulfills a predetermined condition,
  waking up the processing unit based on the signal.

Also, a device is suggested comprising:
  means for determining via a sensor a current that passes a first semiconductor device, wherein the sensor and the semiconductor device are part of a single device,
  means for providing a signal to a processing unit in case the current fulfills a predetermined condition,
  means for waking up the processing unit based on the signal.

EXAMPLE 1

A device comprising:
  a first semiconductor switch;
  an integrated sensor for determining a current that passes the first semiconductor switch; and
  a terminal to which a signal is provided in case the current fulfills a predetermined condition.

EXAMPLE 2

The device according to example 1, wherein the signal provided to the terminal in an idle mode of the device.

EXAMPLE 3

The device according to any combination of examples 1 and 2, wherein the predetermined condition is that the current reaches or exceeds a first threshold current.

EXAMPLE 4

The device according to any combination of examples 1-3, wherein the predetermined condition is that the current reaches or falls below a first threshold current.

EXAMPLE 5

The device according to any combination of examples 1-4, wherein the integrated sensor comprises a second semiconductor switch.

EXAMPLE 6

The device according to example 5, wherein the second semiconductor switch is arranged to provide a portion of the current that passes the first semiconductor switch.

EXAMPLE 7

The device according to any combination of examples 5 and 6, wherein the second semiconductor switch and the first semiconductor switch are arranged as a current mirror, wherein the first semiconductor switch has a larger active area than the second semiconductor switch.

EXAMPLE 8

The device according to any combination of examples 1-7, wherein the device is an integrated switching element.

EXAMPLE 9

The device according to any combination of examples 1-8, comprising an enable terminal, via which the first semiconductor switch can be switched on or off.

EXAMPLE 10

The device according to airy combination of examples 1-9, comprising circuitry which is arranged to:
determine whether or not the current fulfills a predetermined condition, and
provide the signal towards the terminal in case the current fulfills a predetermined condition.

EXAMPLE 11

The device according to example 10, wherein the circuitry is arranged to control the first semiconductor switch in case of an internal condition is met.

EXAMPLE 12

The device according to any combination of examples 1-11, wherein the device is used in an automotive environment.

EXAMPLE 13

A system comprising
device including:
a first semiconductor switch;
an integrated sensor for determining a current that passes the first semiconductor switch; and
a terminal to which a signal is provided in case the current fulfills a predetermined condition, and
a processing unit, wherein the terminal of the device is connected to the processing unit and the signal is conveyed from the processing unit to wake up the processing unit from an idle mode.

EXAMPLE 14

The system according to example 13, wherein the processing unit enables a fuse-characteristics by controlling the first semiconductor switch of the device based on the current provided by the device.

EXAMPLE 15

A method comprising:
determining via a sensor a current has that passes a first semiconductor device, wherein the sensor and the semiconductor device are part of a single device,
providing a signal to a processing unit in case the current fulfills a predetermined condition, and
waking up the processing unit based on the signal.

EXAMPLE 16

A method comprising any combination of examples 1-12 and 15.

EXAMPLE 17

A device comprising:
means for determining via a sensor a current that passes a first semiconductor device, wherein the sensor and the semiconductor device are part of a single device,
means for providing a signal to a processing unit in case the current fulfills a predetermined condition, and
means for waking up the processing unit based on the signal.

EXAMPLE 18

A device of example 17, further comprising means for performing any combination of steps of examples 1-12.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A device comprising:
a semiconductor switch;
a terminal; and
an integrated sensor configured to:
receive a first signal from a microcontroller indicating that the microcontroller is entering an idle mode;
responsive to receiving the first signal, determine whether a current that passes the semiconductor switch fulfills a predetermined condition; and
responsive to determining that the current fulfills the predetermined condition, deliver a second signal to the terminal to wake up the microcontroller from the idle mode.

2. The device according to claim 1, wherein the integrated sensor is configured to deliver the second signal to the terminal in an idle mode of the device.

3. The device according to claim 1, wherein the predetermined condition is that the current reaches or exceeds a first threshold current.

4. The device according to claim 1, wherein the predetermined condition is that the current reaches or falls below a first threshold current.

5. The device according to claim 1,
wherein the semiconductor switch is a first semiconductor switch, and wherein the integrated sensor comprises a second semiconductor switch.

6. The device according to claim 5, wherein the second semiconductor switch is arranged to provide a portion of the current that passes the first semiconductor switch.

7. The device according to claim 5,
wherein the second semiconductor switch and the first semiconductor switch are arranged as a current mirror, and
wherein the first semiconductor switch has a larger active area than the second semiconductor switch.

8. The device according to claim 1, wherein the device is an integrated switching element.

9. The device according to claim 1, further comprising an enable terminal, via which the semiconductor switch can be switched on or off.

10. The device according to claim 1, wherein the circuitry is further configured to control the semiconductor switch in case of an internal condition is met.

11. The device according to claim 1, wherein the device is used in an automotive environment.

12. The device of claim 1,
wherein the integrated sensor is configured to deliver the second signal to the terminal to initiate an interrupt at the microcontroller, and
wherein the interrupt causes the microcontroller to wake up from the idle state.

13. The device of claim 1, wherein the integrated sensor is further configured to:
responsive to receiving the first signal, operate in a first power mode;
responsive to determining that the current does not fulfill the predetermined condition, continue to operate in the first power mode; and
responsive to determining that the current fulfills the predetermined condition, operate in a second power mode, the second power mode being different than the first power mode.

14. A system comprising:
a processing unit; and
a device including:
a semiconductor switch;
a terminal connected to the processing unit; and
an integrated sensor configured to:
receive a first signal from the processing unit indicating that the processing unit is entering an idle mode;
responsive to receiving the first signal, determine whether a current that passes the semiconductor switch fulfills a predetermined condition; and
responsive to determining that the current fulfills the predetermined condition, deliver a second signal to the terminal,
wherein the device is configured to convey the signal from the terminal to the processing unit to wake up the processing unit from the idle mode.

15. The system according to claim 14, wherein the processing unit enables a fuse-characteristics by controlling the semiconductor switch of the device based on the current provided by the device.

16. The system of claim 14,
wherein the integrated sensor is configured to deliver the second signal to the terminal to initiate an interrupt at the processing unit, and
wherein the interrupt causes the processing unit to wake up from the idle state.

17. The system of claim 14, wherein the integrated sensor is further configured to:
responsive to receiving the first signal, operate in a first power mode;
responsive to determining that the current does not fulfill the predetermined condition, continue to operate in the first power mode; and
responsive to determining that the current fulfills the predetermined condition, operate in a second power mode, the second power mode being different than the first power mode.

18. A method comprising:
receiving a first signal from a processing unit indicating that the microcontroller is entering an idle mode;
responsive to receiving the first signal, determining, via a sensor, whether a current that passes a semiconductor device fulfills a predetermined condition, wherein the sensor and the semiconductor device are part of a single device;
responsive to determining that the current fulfills the predetermined condition, delivering a second signal to a processing unit; and
waking up the processing unit from the idle mode based on the second signal.

19. The method of claim 18, further comprising:
initiating an interrupt at the processing unit based on the signal by delivering the second signal; and
causing the processing unit to wake up from the idle state based on the interrupt.

20. A device comprising:
means for receiving a first signal from a processing unit indicating that the microcontroller is entering an idle mode;
means for determining, via a sensor, whether a current that passes a semiconductor device fulfills a predetermined condition, wherein the sensor and the semiconductor device are part of a single device;
means for, responsive to determining that the current fulfills the predetermined condition, delivering a second signal to a processing unit; and
means for waking up the processing unit from the idle mode based on the second signal.

* * * * *